United States Patent [19]

Aoki et al.

[11] Patent Number: 4,768,076
[45] Date of Patent: Aug. 30, 1988

[54] RECRYSTALLIZED CMOS WITH DIFFERENT CRYSTAL PLANES

[75] Inventors: Masaaki Aoki, Minato; Toshiaki Masuhara; Terunori Warabisako, both of Nishitama; Shoji Hanamura, Kokubunji; Yoshio Sakai, Tsukui; Seiichi Isomae, Sayama; Satoshi Meguro, Nishitama; Shuji Ikeda, Koganei, all of Japan

[73] Assignee: Hitachi, Ltd., Tokyo, Japan

[21] Appl. No.: 774,705

[22] Filed: Sep. 11, 1985

[30] Foreign Application Priority Data

Sep. 14, 1984 [JP] Japan .................................. 59-191542
Dec. 12, 1984 [JP] Japan .................................. 59-260698

[51] Int. Cl.⁴ .......................................... H01L 27/04
[52] U.S. Cl. .................................. 357/42; 357/23.7; 357/60; 437/57; 437/83; 437/93; 437/173
[58] Field of Search .......................... 357/60, 23.7, 42

[56] References Cited

U.S. PATENT DOCUMENTS 3,476,991 11/1969 Mize et al. .......................... 357/60
3,603,848 9/1971 Sato et al. ............................ 357/60
3,612,960 10/1971 Takeishi et al. ...................... 357/60

OTHER PUBLICATIONS

Kawamura et al., IEEE IEDM, Technical Digest, pp. 364-367, Dec. 4, 1983.
Gibbons et al., Applied Physics Letters, vol. 34, No. 12, Jun. 15, 1979, pp. 831-833.
Tsaur et al., Applied Physics Letters, vol. 40, No. 4, Feb. 15, 1982, pp. 322-324.

*Primary Examiner*—William D. Larkins
*Attorney, Agent, or Firm*—Antonelli, Terry & Wands

[57] ABSTRACT

A CMOS IC is formed on a semiconductor crystalline surface having a plane azimuth (110) or (023), or of a plane azimuth close thereto (plane azimuth substantially in parallel with the above-mentioned planes), in order to increase the speed of operation.

At low temperatures, dependency of the carrier mobility upon the plane azimuth becomes more conspicuous as shown in FIG. 1, and the difference of mobility is amplified depending upon the planes. Therefore, employment of the above-mentioned crystalline planes helps produce a great effect when the CMOS device is to be operated at low temperature (e.g., 100° K. or lower), and helps operate the device at high speeds.

12 Claims, 9 Drawing Sheets

| TEMP. | GATE LENGTH | PLANE AZIMUTH | WAFER NO. | CARRIER MOBILITY Gm. max (V$_D$=0.02V) | TRANSCON-DUCTANCE Gm. max (V$_D$=5V) |
|---|---|---|---|---|---|
| 300K | 2μ | (100) | #1 | 0.86 | 0.83 |
| | | | 2 | 1 | 1 |
| | | (311) | 3 | 1.20 | 1.37 |
| | | | 4 | 1.39 | 1.52 |
| | | (110) | 5 | 1.34 | 1.70 |
| | | | 6 | 1.37 | 1.57 |
| | | (111) | 7 | 1.24 | 1.55 |
| | | | 8 | 1.23 | 1.47 |
| | 5μ | (100) | #1 | 0.95 | 0.81 |
| | | | 2 | 1 | 1 |
| | | (311) | 3 | 1.50 | 1.51 |
| | | | 4 | 1.39 | 1.62 |
| | | (110) | 5 | 1.60 | 1.80 |
| | | | 6 | 1.55 | 1.69 |
| | | (111) | 7 | 1.38 | 1.58 |
| | | | 8 | 1.50 | 1.48 |
| 77K | 2μ | (100) | #2 | 1 | 1 |
| | | (110) | 5 | 1.46 | 2.17 |
| | 5μ | (100) | #2 | 1 | 1 |
| | | (110) | 5 | 0.60 | 2.52 |

| DEVICE | CHANNEL TYPE | TEMP. | 300K | 77K |
|---|---|---|---|---|
| CONVENTIONAL DEVICE (FORMED ON (100) PLANE SUBSTRATE) | n | PEAK VALUE | 400 cm²/V·sec | 1500 cm²/V·sec |
| | | $V_G = 5V$ | 290 | 1300 |
| | p | PEAK VALUE | 230 | 920 |
| | | $V_G = -5V$ | 120 | 220 |
| DEVICE OF THIS EMBODIMENT (FORMED ON (110) PLANE SUBSTRATE) | n | PEAK VALUE | 400 cm²/V·sec | 1500 cm²/V·sec |
| | | $V_G = 5V$ | 290 | 1300 |
| | p (//⟨0̄11⟩) | PEAK VALUE | 500 | 2000 |
| | | $V_G = -5V$ | 470 | 1400 |

FIG. 9

| TEMPERATURE | 300K | 77K |
|---|---|---|
| CONVENTIONAL DEVICE (FORMED ON (100) PLANE SUBSTRATE) | 1 | 0.45 |
| DEVICE OF THIS EMBODIMENT (FORMED ON (110) PLANE SUBSTRATE) | 0.47 | 0.13 |

RECRYSTALLIZED CMOS WITH DIFFERENT CRYSTAL PLANES

BACKGROUND OF THE INVENTION

The present invention relates to a CMOS IC/LSI, and particularly to a semiconductor integrated circuit which is capable of operating at higher speeds than conventional circuits.

Figure 1:
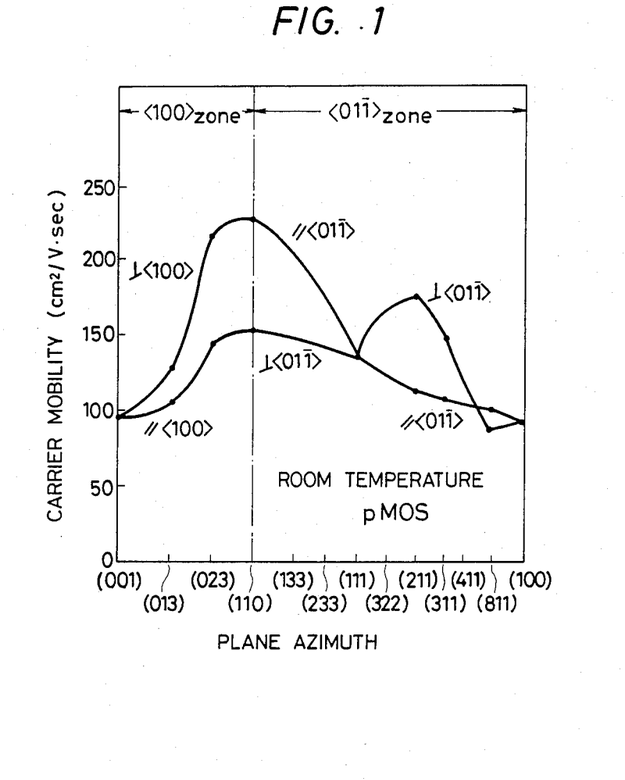
FIG. 1 is a diagram showing the dependency of carrier mobility of a p-channel MOS transistor upon the plane azimuth.

The carrier mobility of an n-channel MOS transistor formed on a silicon crystalline surface is nearly a maximum when the device is formed on the surface of a semiconductor substrate of a plane azimuth (100) as taught in a patent (Japanese patent publication Kokoku No. 42-21976) invented by Ohno et al. Therefore, an MOS integrated circuit has heretofore been formed on the plane (100) or on a plane close thereto. As shown in FIG. 1, however, the measured carrier mobility of a p-channel MOS transistor is nearly minimal when the device is formed on the surface of the plane (100). With a MOS integrated circuit (hereinafter referred to as a CMOS IC) in which n-channel MOS transistors and p-channel MOS transistors are densely formed on the same substrate, the operating speed varies in equal proportion to the carrier mobility of transistors of both the n-and p-types. It is therefore obvious that the plane (100) on which the carrier mobility of the p-channel MOS transistor is nearly minimal, is not utilizable as an optimum plane azimuth for the CMOS IC's.

SUMMARY OF THE INVENTION

The object of the present invention is to provide a CMOS IC structure employing an optimum crystalline plane to operate a CMOS IC at high speed.

Figure 2:
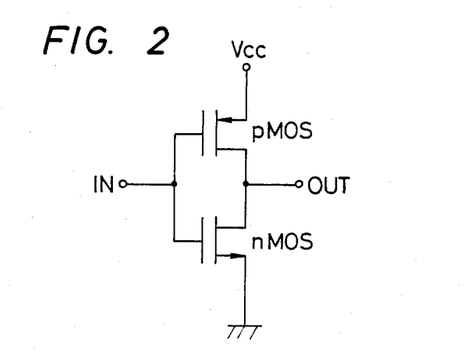
FIG. 2 is a circuit diagram of a CMOS inverter.
Figure 3:
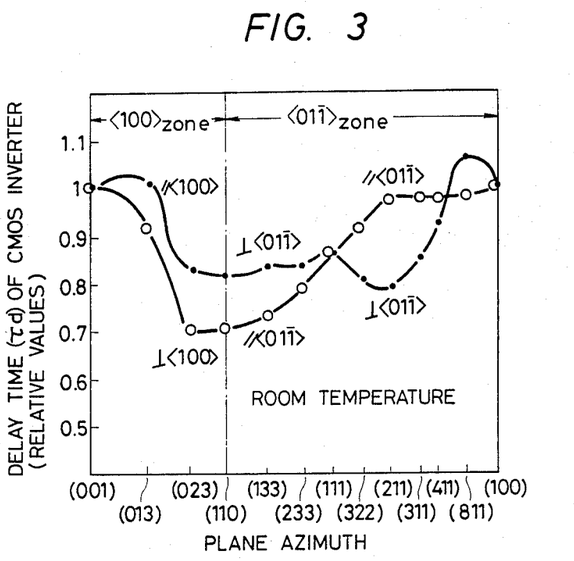
FIG. 3 is a diagram showing the dependency of delay time of a CMOS inverter upon the plane azimuth.

FIG. 3 shows the dependency of delay time of a CMOS inverter of FIG. 2 upon the plane azimuth measured at room temperature. Here, both the n-channel and p-channel MOS transistors are formed to the same size, having the same gate length and gate width. Further, both the n-channel and p-channel MOS transistors have channels formed in the same direction. Results of an inverter having channels formed in parallel with the direction <100> on the plane are marked $\parallel$ <100>, and results of an inverter having channels formed perpendicularly to the direction <100> are marked $\perp$<100>. Results of an inverter having channels formed in parallel with the direction <01$\bar{1}$> on the plane are marked $\parallel$ <01$\bar{1}$>, and the results of an inverter having channels formed perpendicularly to the direction <01$\bar{1}$> are marked $\perp$<01$\bar{1}$>. From the results of dependency of delay time of the inverter upon the plane azimuth shown in FIG. 3, it is obvious that the delay time is minimal on the planes (110) and (023), or on the places close thereto.

In order to produce a CMOS IC which operates at high speed according to the present invention, the CMOS IC is formed on a semiconductor crystalline surface of a plane azimuth (110) or of a plane azimuth (023), or of a plane azimuth close thereto, e.g., a plane azimuth substantially in parallel with the above-mentioned planes.

At low temperatures, dependency of the carrier mobility upon the plane azimuth becomes more conspicuous as shown in FIG. 1, and difference of mobility is amplified depending upon the planes. Therefore, employment of the above-mentioned crystalline planes helps produce a great effect when the CMOS device is to be operated at low temperatures (e.g., 100° K. or lower), and helps to operate the device at high speeds.

DESCRIPTION OF THE PREFERRED EMBODIMENTS

Figure 4:
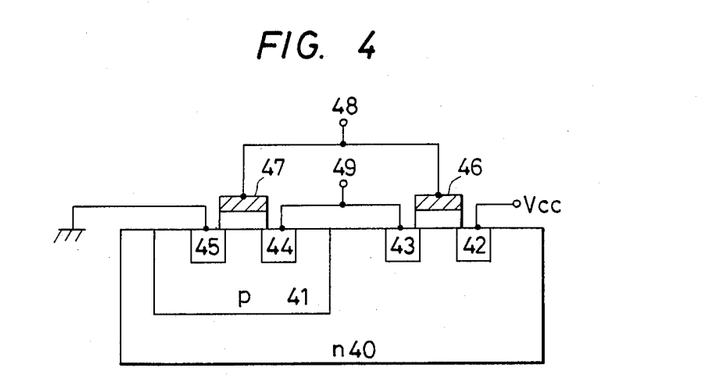
FIG. 4 is a diagram showing a CMOS device structure according to an embodiment of the present invention.

An embodiment of the present invention will be described below with reference to FIG. 4, wherein reference numeral 40 denotes an n-type silicon substrate of a plane azimuth (110) or (023), and 41 denotes a p-type well. In compliance with an ordinary process for producing CMOS devices, a p-channel MOS transistor is formed having p-type high impurity regions 42, 43 as a source and a drain formed in the surface of the substrate 40, and having a gate 46, and an n-channel MOS transistor is also formed having a gate 47 and n-type impurity regions 44, 45 as a drain and a source, that are formed in the surface of the p-type well 41. A CMOS inverter circuit of the present invention is constituted by connecting the regions 46 and 47 together to form an input terminal 48, connecting the regions 43 and 44 together to form an output terminal 49, using the region 42 as a power source terminal, and using the region 45 as a ground terminal.

In this embodiment which employs the plane (110) or (023) as a crystalline plane azimuth of the substrate, the delay time of the CMOS inverter at room temperature can be reduced to about 70% of the conventional value. At a temperature of lower than, for example, 100° K., difference in the mobility is further amplified depending upon the planes, and the delay time can be further reduced to a great extent.

The above embodiment has dealt with the CMOS IC employing the n-type substrate. The invention, however, can also be realized even when the CMOS device is to be produced using a p-type silicon substrate or the azimuth plane (110) of (023).

Described below is a CMOS integrated circuit constructed in a three-dimensional form to provide improved CMOS integrated circuit.

A conventional three-dimensional device has been disclosed, for example, in a literature entitled "3-Dimensional SOI/CMOS IC's Fabricated by Beam Recrystallization" by Kawamura et al., Tech Digest of 1983 IEDM 364 (1983). This device is constructed as shown in FIG. 5.

Figure 5:
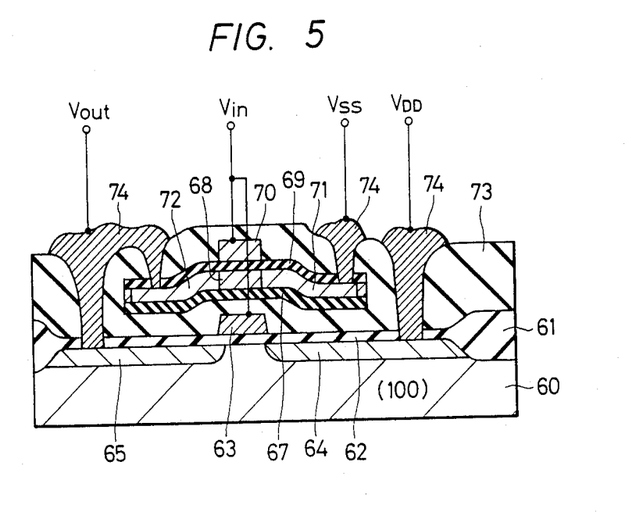
FIG. 5 is a diagram showing the structure of a conventional CMOS device.

That is, in FIG. 5, reference numeral 60 denotes an n-type (100) silicon substrate in which a p-channel MOS transistor is formed having p-type high impurity regions 64, 65 that serve as a source and a drain, having a polycrystalline silicon layer 63 that serves as a gate and having an $SiO_2$ film 62 that serves as a gate insulating film. Reference numeral 61 denotes an $SiO_2$ film for isolating elements, 67 denotes an $Si_3N_4$ film, and 73 denotes a PSG film. Reference numeral 68 denotes a silicon layer which is recrystallized from the polycrystalline silicon layer by the annealing with a CW-Ar laser beam. An n-channel MOS transistor is formed having n-type high impurity regions 71, 72 that serve as a source and a drain, having a polycrystalline silicon layer 70 that serves as a gate, and having an $SiO_2$ film 69 that serves as a gate insulating film. Reference numeral 74 denotes an aluminum electrodes.

With the thus constructed CMOS device, a CMOS inverter is constituted if the source 64 is connected to a power source voltage, the source 71 is connected to ground potential, the gates 63 and 70 are connected to form an input terminal, and the drains 65 and 72 are connected to form an output terminal.

It is, of course, allowable to constitute a CMOS inverter with a p-type plane (100) silicon substrate as the substrate (60), forming an n-type MOS transistor on the lower side, and forming a p-type MOS transistor on the upper side.

In the conventional elements as mentioned, however, an optimum plane azimuth has not been selected concerning the plane azimuth of the substrate 60 and silicon recrystallized layer 68, thus preventing the elements from operating at high speeds.

The present invention provides the structure of a three-dimensional device which is capable of operating at high speeds.

With the three-dimensional device of the present invention which operates at high speeds and which features high performance, the crystalline plane azimuth on the surface of the substrate is made different from the plane azimuth of at least one of the recrystallized thin layers formed on the substrate.

With this structure, the device formed in the substrate and the device formed in a thin layer formed thereon, are allowed to assume optimum plane azimuths, respectively. In particular, the above structure makes it possible to realize a three-dimensional CMOS device that operates at high speeds.

The dependency of carrier mobility of the MOS transistor upon the plane azimuth is nearly maximum on the plane (100) in the case of the n-channel MOS transistor as has been taught in the aforementioned patent (Japanese patent publication Kokoku No. 42-21976) by Ohno et al. and in the literature (Phys. Rev. B, 4, 1950 (1971)) by T. Sato et al. In the case of the p-channel MOS transistor, the dependency of carrier mobility upon the plane azimuth becomes maximum on the plane (110) or (023) as is obvious from the experimental results shown in FIG. 3, and FIGS. 6(A) to 6(D).

Figure 6A:
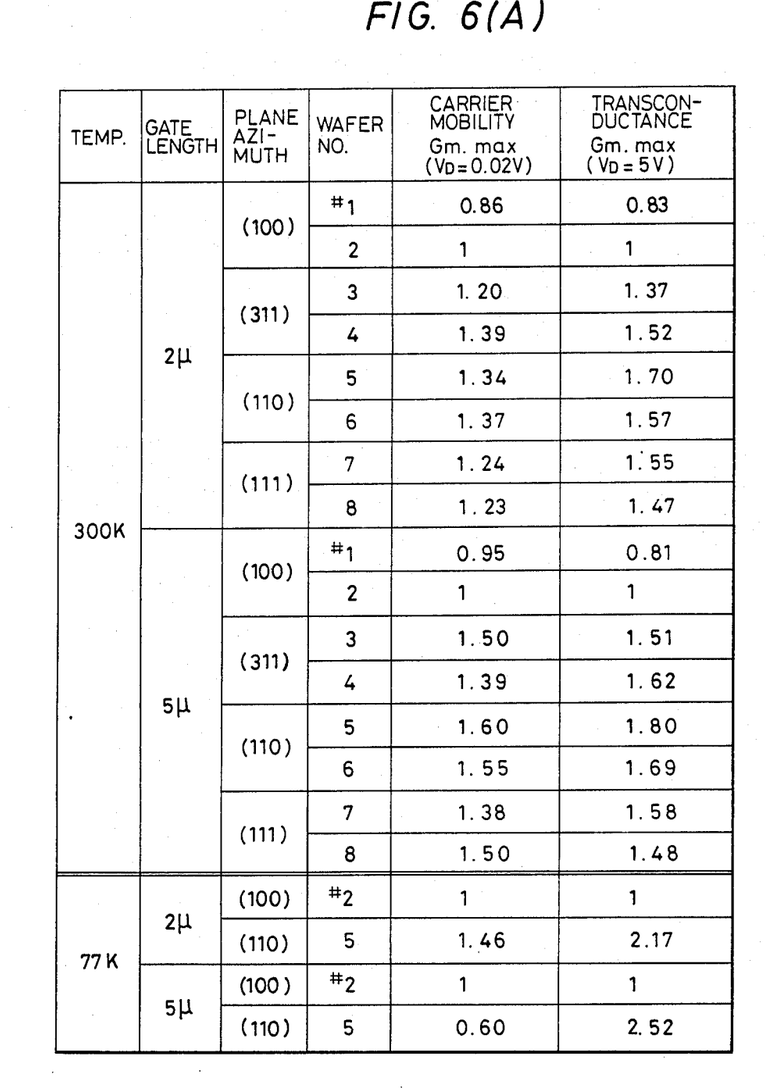
FIGS. 6(A) to 6(D) are diagrams showing the dependency of carrier mobility and transconductance of the p-type MOS transistor upon the plane azimuth.
Figure 6B:
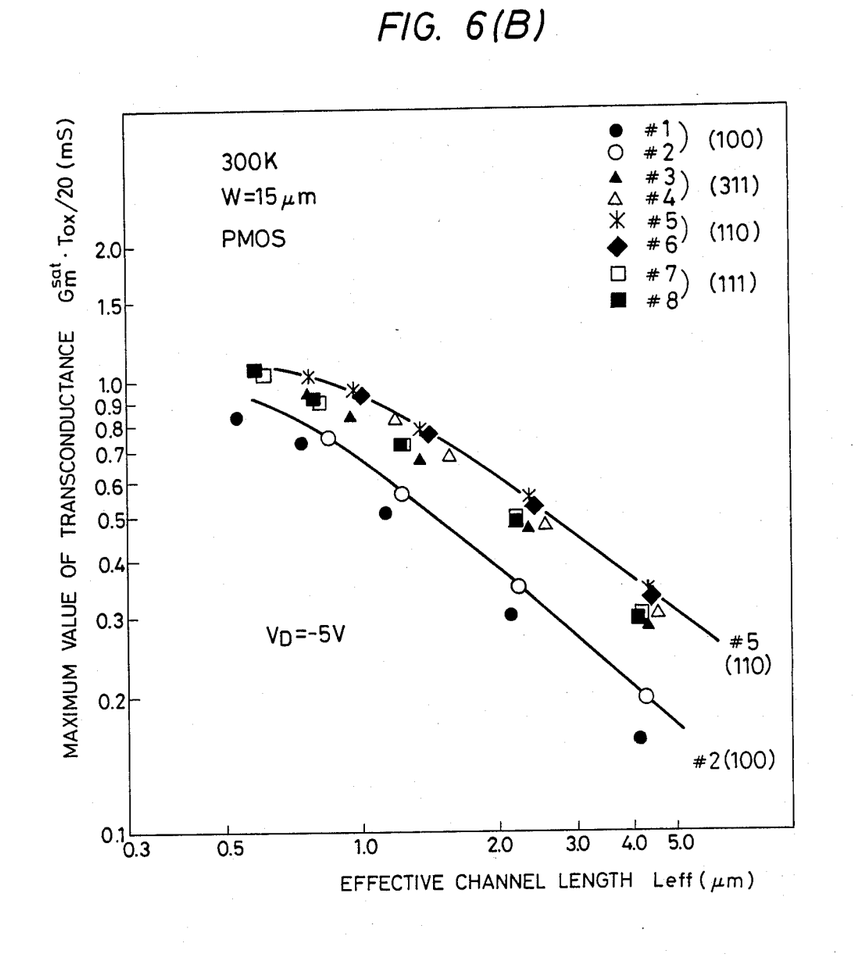
Figure 6C:
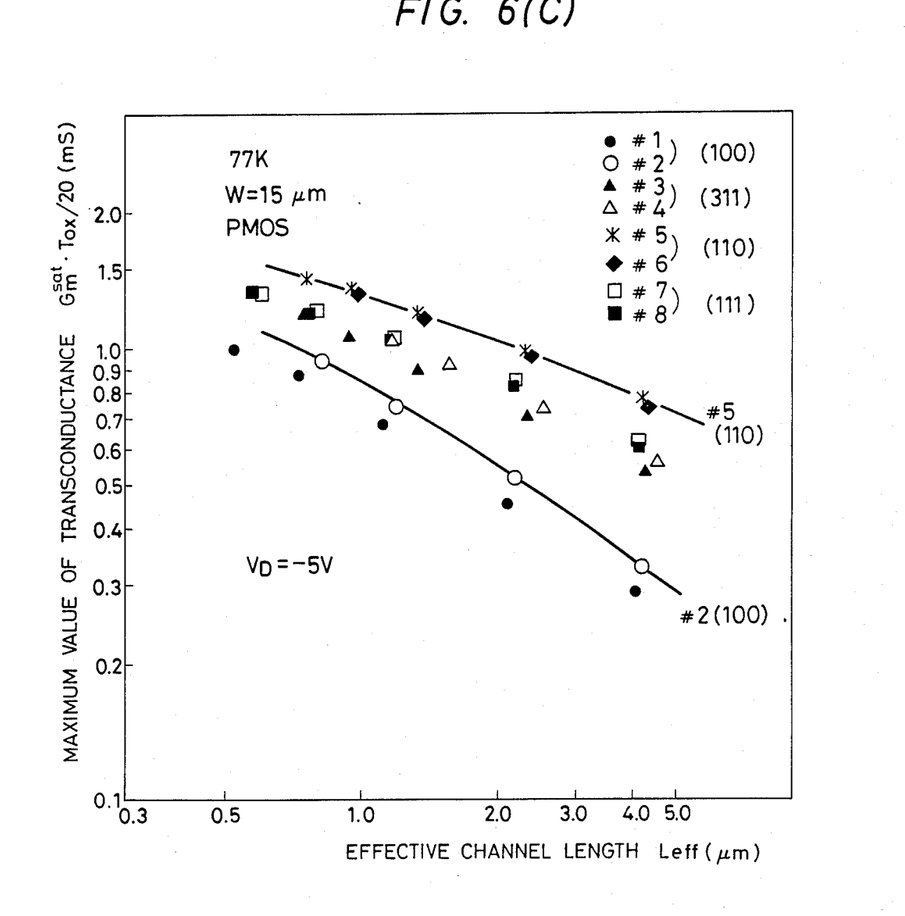
Figure 6D:
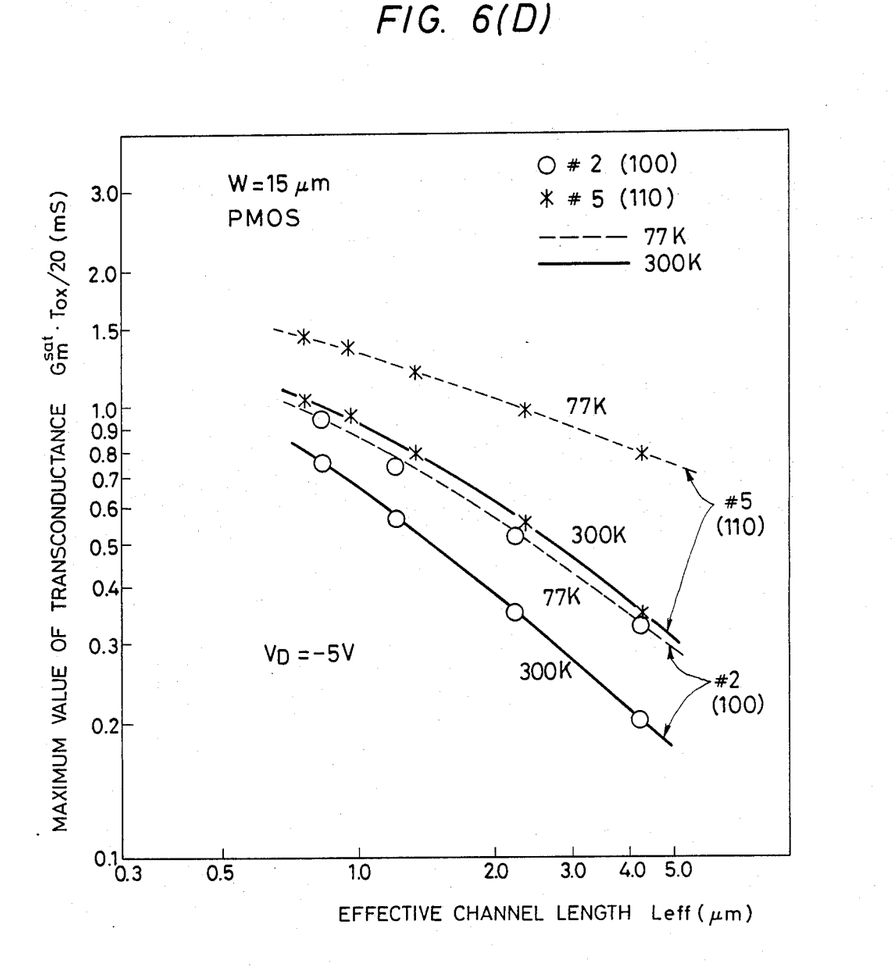

FIGS. 6(A) to 6(D) show experimental values concerned with the dependency of carrier mobility and transconductance of a p-channel MOS transistor upon the plane azimuth. FIG. 6(A) shows differences (relative values) of carrier mobility and transconductance of the p-channel MOS transistor depending upon the plane azimuth, FIGS. 6(B) and 6(C) show the dependency of transconductance upon the plane azimuth at T=300° K. and T=77° K., and FIG. 6(D) shows the dependency of transconductance upon the temperature, comparison of the plane (100) with the plane (110).

With the three-dimensional CMOS device as described above, the plane (100) is selected for the lower substrate, the n-channel MOS transistor is formed thereon, the upper recrystallized silicon layer has the plane (110), and the p-channel MOS transistor is formed thereon to achieve an operating speed higher than that of a conventional device. Or, the plane (110) is selected for the lower substrate, the p-channel MOS transistor is formed thereon, the upper recrystallized silicon layer has the plane (100), and the n-channel MOS transistor is formed thereon to achieve an operating speed higher than that of the conventional device. The same also holds true even when the plane (023) is used instead of the plane (110).

That is, according to the structure of the present invention, the n-channel MOS transistor and the p-channel MOS transistor are formed on the optimum crystalline planes. Namely, the n-channel MOS transistor is formed on the plane (100), and the p-channel MOS transistor is formed on the plane (110) or on the plane (023) to realize a CMOS device that operates at a much faster speed than the conventional devices.

Referring to FIG. 5, it has been experimentally clarified that if the polycrystalline silicon layer is deposited on the $Si_3N_4$ layer 67, or if the polycrystalline silicon layer is deposited on the $SiO_2$ layer and is recrystallized by irradiation with a laser beam, instead of forming the $Si_3N_4$ layer 67, the surface of the recrystallized layer exhibits the plane azimuth (100) at all times. This is attributed to the fact that free energy on the interface between the silicon layer and the $Si_3N_4$ or $SiO_2$ layer is minimum when the recrystallization takes place on the plane azimuth (100). To obtain the recrystallized layer on a plane other than the plane azimuth (100), a seed crystal must be present, thereby complicating the manufacturing process. Therefore, the plane azimuth of the recrystallized silicon layer on the $Si_3N_4$ or $SiO_2$ layer should optimally be the plane (100).

To provide a three-dimensional CMOS device which operates at high speed, therefore, the p-channel MOS transistor should optimally be formed on the plane (110) or (023) that is selected on for the lower substrate, and the n-channel MOS transistor should be formed on the upper recrystallized silicon layer that has the plane (100), thereby increasing the carrier mobility and simplifying the manufacturing process.

At low temperatures, the carrier mobility varies more depending upon the plane azimuth, and the difference of carrier mobility depending upon the plane is amplified. Therefore, the device of the above-mentioned structure exhibits its greatest effect when it is operated at low temperature. Further, the device operates at high speed at low temperatures.

In particular, the CMOS IC operates at high speed at low temperatures. Accordingly, it is possible to realize a very high-speed device producing such a feature that the device is highly integrated while consuming reduced amounts of electric power that is inherent in the CMOS IC.

Figure 7:
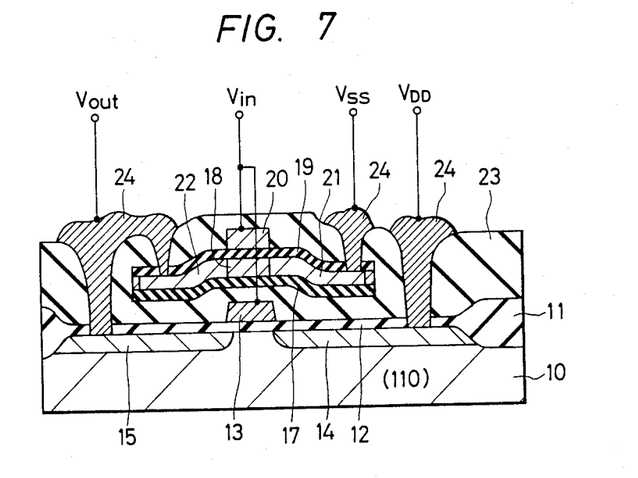
FIG. 7 is a diagram showing the structure of a three-dimensional CMOS device according to the embodiment of the present invention.

One embodiment of the invention will be described below with reference to FIG. 7, wherein reference numeral 10 denotes an n-type silicon (110) substrate in which a p-channel MOS transistor is formed having p-type high impurity regions 14, 15 that serve as source and a drain, having a polycrystalline layer 13 that serves as a gate, and having an $SiO_2$ film 12 that serves as a gate insulating film. Reference numeral 11 denotes an $SiO_2$ film for isolating the elements, 17 denotes an $Si_3N_4$ film, and 23 denotes a PSG film. Reference numeral 18 denotes a thin recrystallized silicon film having a crystalline plane azimuth (100). An n-channel MOS transistor is also formed having n-type high impurity regions 21, 22 that serve as a source and a drain, having a polycrystalline silicon layer 20 as a gate, and having an $SiO_2$ film 19 as a gate insulating film. Reference numeral 24 denotes an aluminum electrode layer. The CMOS inverter circuit of the present invention is constituted by using the source 14 as a power source terminal, using the source 21 as a ground terminal, connecting the gates 13 and 20 to form an input terminal, and connecting the drains 15 and 22 to form an output terminal.

Figure 8:
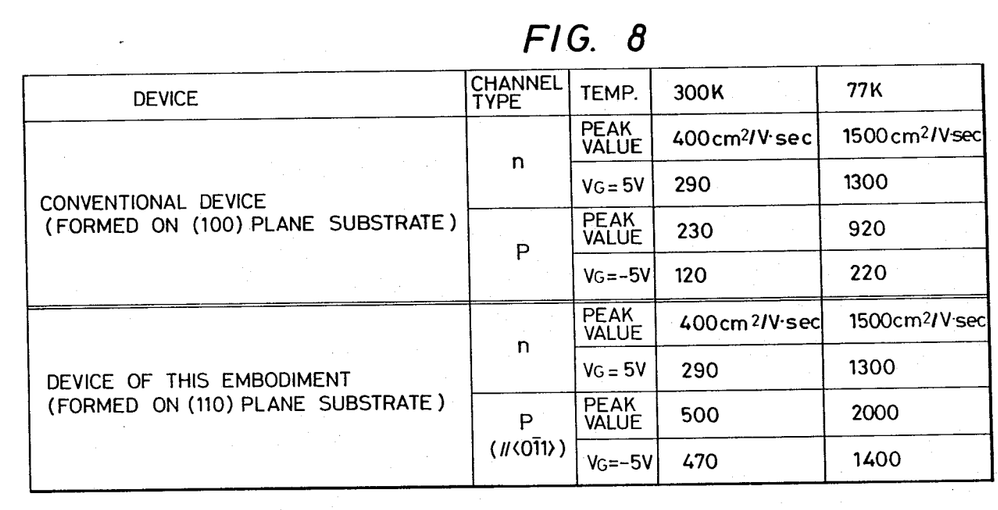
FIG. 8 is a diagram showing field effect mobility of the MOS transistor measured for the CMOS device of the embodiment of FIG. 7 in comparison with that of a conventional structure.
Figure 9:
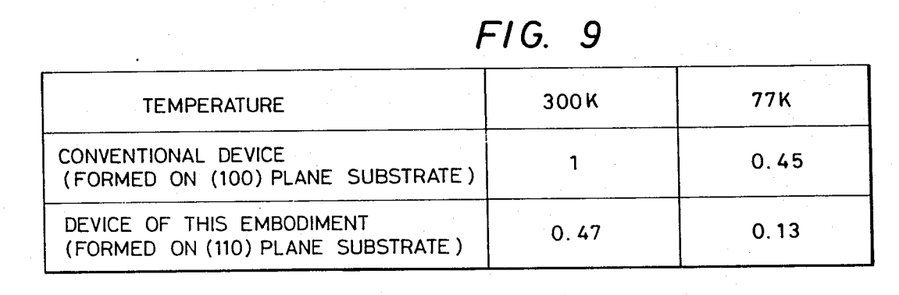
FIG. 9 is a diagram showing delay in the signal propagation of the CMOS inverter of the present invention in comparison with that of a conventional structure.

FIG. 8 shows the field effect mobility of a MOS transistor measured using the CMOS IC of this embodiment where the gate oxide film is 35 nm thick in comparison with that of a conventional device. With this embodiment in which the p-channel MOS transistor is formed on the plane (110), the peak value in the carrier mobility increases by two or more times compared with the conventional values. When the gate voltage is set to $-5$ V, the peak value in the carrier mobility increases by about four times at room temperature, and increases by about 6.5 times at 77° K. In the foregoing was mentioned the carrier mobility of the p-channel MOS transistor in a direction parallel with the direction (011). Owing to the increased carrier mobility of the p-type MOS transistor, the signal propagation delay (relative value) of the CMOS inverter of the present invention is reduced to about one-half the conventional value at 300° K., and is reduced to smaller than one-third the conventional value at 77° K. as shown in FIG. 9.

A process for producing the device of the embodiment of FIG. 7 will be described below in conjunction with FIGS. 10(A) to 10(D) which are diagrams showing the processing steps.

Figure 10A:
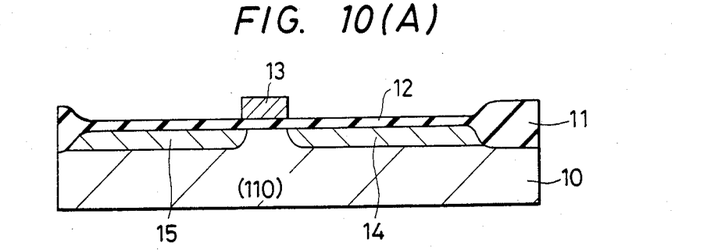
FIG. 10 is a diagram showing a process for producing the device of the embodiment of FIG. 7.

First, as shown in FIG. 10(A), an $SiO_2$ film 11 which is as thick as 0.5 to 1.0 μm for isolating elements is formed on the surface of an n-type silicon (110) substrate 10, and then a gate oxide film 12 which is as thin as 5 to 50 nm is formed thereon by the thermal oxidation method. A polycrystalline silicon layer 13 is deposited on the gate oxide film 12 to form a gate electrode of the p-channel MOS transistor. Boron ions ($B^+$) are then implanted with the energy of 40 keV in a dosage of $10^{15}$ to $10^{16}$ cm$^{-2}$ to form source and drain regions 14, 15 of the p-channel MOS transistor.

Figure 10B:
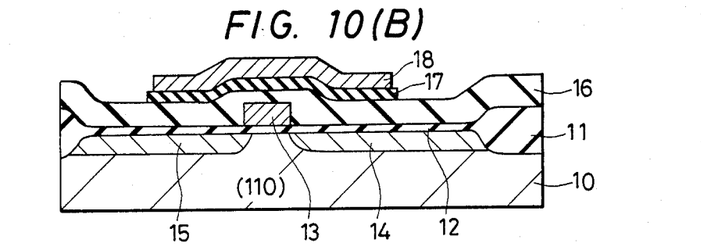

Then, as shown in FIG. 10(B), a PSG film 16 is deposited to a thickness of 800 nm, an $Si_3N_4$ film 17 is deposited thereon to a thickness of 100 nm, and a polycrystalline silicon layer 18 is deposited thereon to a thickness of 400 to 450 nm by the LPCVD method. The polycrystalline silicon layer 18 is then recrystallized being irradiated with CW-Ar laser. The power of the laser beam is 4 to 5 watts, the spot size is 40 μm, the scanning speed is 12 cm/s, and the substrate temperature is set at 450° C. The recrystallized silicon layer 18 is cut by dry etching to form an island region as shown. In this case, the recrystallized silicon layer 18 so grows that the free energy becomes minimal on the interface relative to the $Si_3N_4$ film 17, and assumes the plane azimuth (100).

Figure 10C:
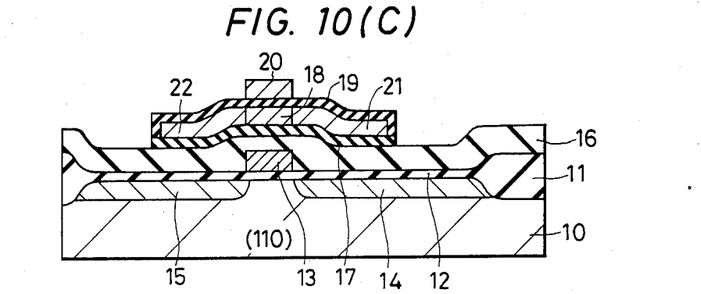

Referring to FIG. 10(C), a gate oxide film 19 having a thickness of 5 to 50 nm is formed on the recrystallized silicon layer 18 by the thermal oxidation method, and a polycrystalline silicon layer 20 is deposited thereon to form a gate electrode of the n-channel MOS transistor. Then, source and drain regions 21, 22 of the n-channel MOS transistor are formed by implanting arsenic ions ($As^+$) with the energy of 150 keV in a dosage of 2 to $3 \times 10^{25}$ cm$^{-2}$.

Figure 10D:
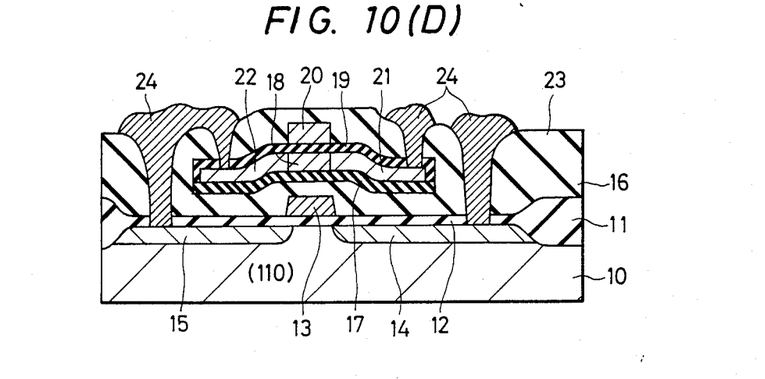

Finally, a PSG film 23 is deposited to a thickness of 700 nm to protect the surface, and then an aluminum wiring layer 24 is formed by vapor deposition to realize a desired three-dimensional CMOS device which operates at high speeds and which features high performance.

The above embodiment has dealt with the CMOS device employing an n-type silicon (110) substrate. However, it is evident that the high-speed CMOS device of the present invention is also applicable to the case where the n-channel MOS transistor is formed in the surface of the p-type silicon (100) substrate, the plane azimuth of the recrystallized thin silicon layer is set to the plane (110), and the p-channel MOS transistor is formed in the surface of the plane (110).

As mentioned earlier, dependency of the carrier mobility and transconductance of the p-channel MOS transistor is shown in FIG. 6. As will be obvious from FIG. 6, mobility is greater on the plane (311) and on the plane (111) than on the plane (100). Therefore, the present invention can be adapted even when use is made of a substrate having crystalline surfaces other than the (110) silicon substrate surface that was employed in the embodiment of FIG. 1. Even in this case, the CMOS device operates at speeds faster than the conventional devices.

Although the above embodiments have dealt with the cases where there exists a single recrystallized thin layer, the invention can, of course, be adapted to the cases where there exist two or more thin layers, and the azimuth of crystalline surface of each of the thin layers is optimized such that the device formed in each of the thin layers will exhibit maximum performance.

With the three-dimensional device of the present invention as described in the foregoing, the plane azimuth of the substrate is set to be different from the plane azimuth of the upper single crystalline thin semiconductor layer. This fact makes it possible to provide a three-dimensional device which operates at high speeds and which exhibits high performance, as is obvious from the above-mentioned embodiments.

What is claimed is:

1. A semiconductor device comprising:
    a semiconductor substrate which has a first substantially flat surface lying substantially parallel to a (100) plane;
    an insulating film formed on said first substantially flat surface;
    a semiconductor layer, which is deposited on said insulating film and recrystallized by laser irradiation, and which has a second substantially flat surface lying substantially parallel to a (110) plane; and
    source and drain regions of a n-channel MOS transistor formed at said first substantially flat surface of said semiconductor substrate, and source and drain regions of a p-channel MOS transistor formed at said second substantially flat surface of said semiconductor layer.

2. A semiconductor device according to claim 1, wherein said semiconductor substrate and said semiconductor layer are formed of silicon.

3. A semiconductor device according to claim 2, wherein said semiconductor substrate has p-type conductivity.

4. A semiconductor device according to claim 1, wherein said insulating film includes at least a $Si_3N_4$ film.

5. A semiconductor device according to claim 1, wherein said p-channel MOS transistor and said n-channel MOS transistor are connected with each other so as to form an inverter.

6. A semiconductor device according to any one of claims 1-5, wherein said semiconductor device is adapted to operate at a temperature below 100° K.

7. A semiconductor device comprising:
a semiconductor substrate which has a first substantially flat surface lying substantially parallel to a (100) plane;
an insulating film formed on said substantially flat surface;
a semiconductor layer, which is deposited on said insulating film and recrystallized, and which has a second substantially flat surface lying substantially parallel to a (110) plane; and
source and drain regions of a n-channel MOS transistor formed at said first substantially flat surface of said semiconductor substrate, and source and drain regions of a p-channel MOS transistor formed at said second substantially flat surface of said semiconductor layer.

8. A semiconductor device according to claim 7, wherein said semiconductor substrate and said semiconductor layer are formed of silicon.

9. A semiconductor device according to claim 8, wherein said semiconductor substrate has p-type conductivity.

10. A semiconductor device according to claim 8, wherein said insulating film includes at least $Si_3N_4$ film.

11. A semiconductor device according to claim 8, wherein said p-channel MOS transistor and said n-channel MOS transistor are connected with each other so as to form an inverter.

12. A semiconductor device according to any one of claims 7-11, wherein said semiconductor device is adapted to operate at temperature below 100° K.

* * * * *